(12) United States Patent
Pun et al.

(10) Patent No.: US 11,424,394 B2
(45) Date of Patent: Aug. 23, 2022

(54) LED PACKAGE WITH MULTIPLE ELEMENT LIGHT SOURCE AND ENCAPSULANT HAVING CURVED AND/OR PLANAR SURFACES

(71) Applicant: CreeLED, Inc., Durham, NC (US)

(72) Inventors: Arthur Pun, Raleigh, NC (US); Jeremy Nevins, Cary, NC (US); Jesse Reiherzer, Wake Forest, NC (US); Joseph Clark, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 16/664,686

(22) Filed: Oct. 25, 2019

(65) Prior Publication Data

US 2021/0249572 A1    Aug. 12, 2021

Related U.S. Application Data

(63) Continuation of application No. 14/575,805, filed on Dec. 18, 2014, now Pat. No. 10,468,565, which is a
(Continued)

(51) Int. Cl.
*H01L 25/07*    (2006.01)
*H01L 33/60*    (2010.01)
(Continued)

(52) U.S. Cl.
CPC .......... *H01L 33/54* (2013.01); *H01L 25/0753* (2013.01); *H01L 24/48* (2013.01);
(Continued)

(58) Field of Classification Search
CPC . H01L 25/0753; H01L 33/486; H01L 33/483; H01L 33/60; H01L 33/52;
(Continued)

(56) References Cited

U.S. PATENT DOCUMENTS

| 4,013,916 A | 3/1977 | Brown |
| 4,143,394 A | 3/1979 | Schoberl ........................ 257/680 |

(Continued)

FOREIGN PATENT DOCUMENTS

| CN | 1380703 | 11/2002 |
| CN | 1776506 | 5/2006 |

(Continued)

OTHER PUBLICATIONS

Office Action for U.S. Appl. No. 13/902,080; dated May 25, 2018.
(Continued)

*Primary Examiner* — Didarul A Mazumder
(74) *Attorney, Agent, or Firm* — Withrow & Terranova, P.L.L.C.

(57) ABSTRACT

LED packages are disclosed that are compact and efficiently emit light, and can comprise encapsulants with planar surfaces that refract and/or reflect light within the package encapsulant. The LED package are also directed to features or arrangements that allow for improved or tailored emission characteristic for LED packages according to the present invention. Some of these features or arrangements include, but are not limited to, higher ratio of light source size to submount size, the used of particular materials (e.g. different silicones) for the LED package layers, improved arrangement of a reflective layer, improved composition and arrangement of the phosphor layer, tailoring the shape of the encapsulant, and/or improving the bonds between the layers. There are only some of the improvements disclosed herein, with some of these resulting in LED packages the emit light with a higher luminous intensity over conventional LED packages.

19 Claims, 10 Drawing Sheets

Related U.S. Application Data continuation-in-part of application No. 13/770,389, filed on Feb. 19, 2013, now abandoned, which is a continuation-in-part of application No. 13/649,067, filed on Oct. 10, 2012, now Pat. No. 9,818,919, and a continuation-in-part of application No. 13/649,052, filed on Oct. 10, 2012, now Pat. No. 9,048,396.

(60) Provisional application No. 62/073,256, filed on Oct. 31, 2014, provisional application No. 61/658,271, filed on Jun. 11, 2012, provisional application No. 61/660,231, filed on Jun. 15, 2012, provisional application No. 61/696,205, filed on Sep. 2, 2012.

(51) Int. Cl.
    *H01L 33/54* (2010.01)
    *H01L 25/075* (2006.01)
    *H01L 33/48* (2010.01)
    *H01L 33/50* (2010.01)
    *H01L 23/00* (2006.01)

(52) U.S. Cl.
    CPC ............ *H01L 24/49* (2013.01); *H01L 33/486* (2013.01); *H01L 33/508* (2013.01); *H01L 33/60* (2013.01); *H01L 2224/48091* (2013.01); *H01L 2224/48227* (2013.01); *H01L 2224/48247* (2013.01); *H01L 2224/49113* (2013.01); *H01L 2224/49175* (2013.01); *H01L 2224/73265* (2013.01); *H01L 2924/00014* (2013.01); *H01L 2924/181* (2013.01)

(58) Field of Classification Search
    CPC . H01L 2224/48091; H01L 2224/49175; H01L 2924/181
    USPC .............................. 257/88; 438/22, 24, 46, 47
    See application file for complete search history.

(56) References Cited

U.S. PATENT DOCUMENTS

| | | | |
|---|---|---|---|
| 6,350,043 B1 | 2/2002 | Tersa et al. | |
| 6,521,915 B2 | 2/2003 | Odaki et al. | 257/98 |
| 6,686,676 B2 | 2/2004 | McNulty et al. | 313/112 |
| 6,867,542 B1 | 3/2005 | Sun | |
| 7,009,343 B2 | 3/2006 | Lim et al. | 315/150 |
| 7,213,940 B1 | 5/2007 | Van de Ven et al. | |
| 7,253,448 B2 | 8/2007 | Roberts et al. | |
| 7,614,759 B2 | 11/2009 | Negley | |
| 7,722,220 B2 | 5/2010 | Van de Ven et al. | |
| 7,762,692 B2 | 7/2010 | Lai et al. | |
| D646,235 S | 10/2011 | Kuwaharada | |
| D650,342 S | 12/2011 | Kuwaharada | D13/180 |
| 8,450,147 B2 | 5/2013 | Chandra | 438/106 |
| 2002/0163302 A1 | 11/2002 | Nitta et al. | |
| 2003/0008431 A1 | 1/2003 | Matsubara et al. | |
| 2004/0130880 A1 | 7/2004 | Min et al. | |
| 2004/0217364 A1* | 11/2004 | Tarsa | H01L 25/0753 257/89 |
| 2004/0218390 A1 | 11/2004 | Holman | 362/245 |
| 2004/0227149 A1 | 11/2004 | Ibbetson et al. | 257/100 |
| 2005/0073840 A1 | 4/2005 | Chou et al. | |
| 2005/0093005 A1 | 5/2005 | Ruhnau et al. | 257/79 |
| 2005/0173708 A1 | 8/2005 | Suehiro et al. | |
| 2005/0211991 A1* | 9/2005 | Mori | H01L 33/501 257/79 |
| 2006/0049421 A1 | 3/2006 | Suehiro et al. | |
| 2006/0060882 A1 | 3/2006 | Ohe et al. | |
| 2006/0097245 A1 | 5/2006 | Aanegola | 257/26 |
| 2006/0097385 A1 | 5/2006 | Negley | 257/722 |
| 2006/0124946 A1 | 6/2006 | Fujita | |
| 2006/0138437 A1 | 6/2006 | Huang | 257/98 |
| 2006/0186431 A1 | 8/2006 | Miki | 257/100 |
| 2006/0273337 A1 | 12/2006 | Han et al. | |
| 2006/0278886 A1 | 12/2006 | Tomoda et al. | |
| 2007/0029569 A1 | 2/2007 | Andrews | 257/99 |
| 2007/0096131 A1 | 5/2007 | Chandra | 257/99 |
| 2007/0102721 A1 | 5/2007 | DenBaars | |
| 2007/0108463 A1 | 5/2007 | Chua et al. | |
| 2007/0145397 A1 | 6/2007 | DenBaars | |
| 2007/0152231 A1 | 7/2007 | Destain | |
| 2007/0201225 A1 | 8/2007 | Holder et al. | 362/227 |
| 2007/0262339 A1 | 11/2007 | Hussell | 257/99 |
| 2007/0284589 A1 | 12/2007 | Ng | 257/79 |
| 2008/0006839 A1 | 1/2008 | Lin | 257/98 |
| 2008/0012036 A1 | 1/2008 | Loh | 257/99 |
| 2008/0179611 A1* | 7/2008 | Chitnis | H01L 33/508 257/98 |
| 2008/0258168 A1 | 10/2008 | Loh | |
| 2008/0290351 A1* | 11/2008 | Ajiki | H01L 27/15 257/E33.061 |
| 2009/0050907 A1 | 2/2009 | Yuan et al. | 257/88 |
| 2009/0057699 A1 | 3/2009 | Basin | |
| 2009/0091045 A1 | 4/2009 | Tanikawa et al. | 257/791 |
| 2009/0262515 A1 | 10/2009 | Lee et al. | 362/84 |
| 2009/0272995 A1 | 11/2009 | Ito et al. | |
| 2009/0278147 A1 | 11/2009 | Suzuki | |
| 2010/0121331 A1 | 5/2010 | Sharp et al. | 257/98 |
| 2010/0128191 A1 | 6/2010 | Shai | 257/88 |
| 2010/0140633 A1 | 6/2010 | Emerson | |
| 2010/0140634 A1 | 6/2010 | Van de Ven | 257/88 |
| 2010/0155763 A1 | 6/2010 | Donofrio et al. | |
| 2010/0252851 A1 | 10/2010 | Emerson et al. | 257/98 |
| 2010/0276712 A1 | 11/2010 | Shaikevitch | 257/98 |
| 2010/0291374 A1 | 11/2010 | Akarsu | 428/328 |
| 2011/0001151 A1 | 1/2011 | Le Toquin | 257/98 |
| 2011/0001161 A1 | 1/2011 | Park | |
| 2011/0031527 A1 | 2/2011 | Kotani et al. | |
| 2011/0140289 A1 | 6/2011 | Shiobara et al. | 257/789 |
| 2011/0156061 A1 | 6/2011 | Wang et al. | |
| 2011/0215345 A1 | 9/2011 | Tarsa et al. | 257/88 |
| 2011/0220920 A1 | 9/2011 | Collins et al. | 257/88 |
| 2011/0221330 A1 | 9/2011 | Negley et al. | |
| 2011/0228514 A1 | 9/2011 | Tong et al. | 362/84 |
| 2011/0279054 A1 | 11/2011 | Katona | 315/291 |
| 2011/0291131 A1 | 12/2011 | Ito | |
| 2011/0316006 A1 | 12/2011 | Xu | |
| 2012/0043563 A1 | 2/2012 | Ibbetson | 257/88 |
| 2012/0061703 A1 | 3/2012 | Kobayashi | |
| 2012/0062821 A1 | 3/2012 | Takeuchi et al. | |
| 2012/0068198 A1 | 3/2012 | Andrews et al. | 257/88 |
| 2012/0068209 A1 | 3/2012 | Andrews | |
| 2012/0087124 A1 | 4/2012 | Ravillisetty | 362/235 |
| 2012/0112220 A1 | 5/2012 | West | |
| 2012/0119234 A1 | 5/2012 | Shioi | |
| 2012/0193651 A1 | 8/2012 | Edmond et al. | 257/88 |
| 2012/0193662 A1 | 8/2012 | Donofrio | 257/98 |
| 2012/0193665 A1 | 8/2012 | Yamada | |
| 2012/0241784 A1* | 9/2012 | Tang | H01L 33/507 257/98 |
| 2012/0248483 A1 | 10/2012 | Beppu | 257/98 |
| 2013/0020600 A1 | 1/2013 | Yoo | 257/98 |
| 2013/0033186 A1 | 2/2013 | Miyashita | |
| 2013/0049025 A1 | 2/2013 | Chang | |
| 2013/0105835 A1 | 5/2013 | Wu | 257/89 |
| 2013/0140580 A1 | 6/2013 | Wirth | 257/76 |
| 2013/0300285 A1 | 11/2013 | Ito | |
| 2013/0320369 A1 | 12/2013 | Gartner | |
| 2013/0334559 A1 | 12/2013 | Vdovin et al. | 257/98 |
| 2014/0027795 A1 | 1/2014 | Reiherzer | 257/88 |
| 2015/0221837 A1 | 8/2015 | Yonezaki | |

FOREIGN PATENT DOCUMENTS

| | | |
|---|---|---|
| CN | 1802756 | 7/2006 |
| EP | 0441622 A1 | 2/1991 |
| EP | 1529807 A2 | 5/2005 |
| EP | 2042528 A1 | 9/2007 |
| EP | 2113949 A2 | 11/2009 |
| EP | 2196501 A1 | 12/2009 |
| EP | 2149920 A1 | 2/2010 |
| EP | 2336230 A1 | 6/2011 |

(56) References Cited

FOREIGN PATENT DOCUMENTS

| | | |
|---|---|---|
| JP | 878732 A | 3/1996 |
| JP | 2001301230 | 10/2001 |
| JP | 2006165029 | 6/2006 |
| JP | WO 2012099145 A1 | 6/2014 |
| KR | 100809658 | 3/2008 |
| WO | WO 2006059828 | 6/2006 |
| WO | WO 2006060141 A2 | 6/2006 |
| WO | WO 061650 A1 | 5/2011 |
| WO | WO 2011129383 A1 | 10/2011 |
| WO | WO 2012016850 A1 | 2/2012 |
| WO | WO 2012084451 A1 | 6/2012 |
| WO | WO 2012/091971 A1 | 7/2012 |
| WO | WO 2012120434 | 9/2012 |
| WO | WO 2013099139 A1 | 7/2013 |

OTHER PUBLICATIONS

Office Action for U.S. Appl. No. 14/633,734; dated Jun. 29, 2018.
Office Action for U.S. Appl. No. 13/770,389; dated Feb. 22, 2018.
Office Action for U.S. Appl. No. 14/183,218; dated Apr. 25, 2018.
Office Action for U.S. Appl. No. 14/633,734; dated Sep. 20, 2017.
Office Action for U.S. Appl. No. 13/770,389; dated Sep. 22, 2017.
Office Action for U.S. Appl. No. 13/051,894; dated Sep. 29, 2017.
Office Action for U.S. Appl. No. 13/902,080; dated Oct. 31, 2017.
Chinese Office Action for Application No. 201380030664.6; dated Jul. 17, 2017.
Chinese Office Action for Application No. 2013800306646; dated Jul. 26, 2017.
Office Action for U.S. Appl. No. 14/183,218; dated Sep. 11, 2017.
Office Action for U.S. Appl. No. 13/770,389; dated Mar. 9, 2017.
Office Action for U.S. Appl. No. 13/051,894; dated Mar. 23, 2017.
Office Action for U.S. Appl. No. 14/183,218; dated Apr. 5, 2017.
Foreign Notice of Allowance for Taiwan Application No. 102120670; dated May 1, 2017.
Office Action for U.S. Appl. No. 13/051,894, dated Oct. 3, 2016.
Foreign Office Action for European Patent Appl. No. 13730742.7; dated Oct. 14, 2016.
Office Action for U.S. Appl. No. 14/633,734, dated Nov. 3, 2016.
Foreign Office Action for European Application No. 14742722 3: dated Nov. 3, 2016.
Foreign Office Action for Taiwan Application No. 04489/10521496400; dated Dec. 5, 2016.
Office Action for U.S. Appl. No. 13/649,067, dated Dec. 15, 2016.
Office Action from Chinese Application No. 2013800306646; dated Jun. 15, 2016.
Office Action for U.S. Appl. No. 13/902,080; dated Aug. 12, 2016.
Office Action for U.S. Appl. No. 13/770,389; dated Aug. 17, 2016.
Office Action for U.S. Appl. No. 14/183,218; dated Sep. 6, 2016.
Office Action for U.S. Appl. No. 13/957,290; dated Sep. 12, 2016.
Office Action from U.S. Appl. No. 13/051,894, dated Mar. 1, 2016.
Office Action from U.S. Appl. No. 13/770,389, dated Mar. 23, 2016.
Office Action from U.S. Appl. No. 14/183,218, dated Mar. 24, 2016.
Office Action from U.S. Appl. No. 13/649,067; dated Apr. 14, 2016.
Notification of Entry into European Phase for Appl. No. 14742722. 3; dated Mar. 18, 2016.
Notice of Allowance letter from Chinese Patent Appl. No. ZL201210031021.0, dated Jan. 5, 2016.
Office Action from U.S. Appl. No. 13/957,290; dated Jan. 21, 2016.
Office Action from U.S. Appl. No. 14/183,218, dated Aug. 10, 2015.
Office Action from U.S. Appl. No. 13/051,894, dated Sep. 21, 2015.
Office Action from U.S. Appl. No. 13/908,080, dated Sep. 24, 2015.
Office Action from U.S. Appl. No. 13/649,067, dated Oct. 1, 2015.
Office Action from U.S. Appl. No. 13/770,389, dated Oct. 26, 2015.
Fourth Office Action from Chinese Patent Appl No. 2012100310210. dated Jul. 16, 2015.
Decision to Grant from German Patent Appl. No. 10 2007 040 8112, dated Jul. 3, 2015.
Office Action from U.S. Appl. No. 13/902,080, dated Jun. 2, 2015.
Office Action from U.S. Appl. No. 13/770,385, dated Jul. 1, 2015.

Office Action from U.S. Appl. No. 13/957,290, dated Jul. 6, 2015.
International Preliminary Report on Patentability from Appl. No. PCT/US2013/062640, dated Apr. 23, 2015.
Office Action from German Patent Appl. No. 10 2007 040 811.2, dated Feb. 12, 2015.
Office Action from U.S. Appl. No. 13/649,067, dated Feb. 18, 2015.
Office Action from U.S. Appl. No. 13/770,389, dated Mar. 12, 2015.
Notification of the Third Office Action from Chinese Patent Appl. No. 201210031021.0, dated Jan. 28, 2015.
Correction of Deficiencies notice from European Patent Appl. No. 13730742.7-1551, dated Feb. 3, 2015.
Office Action from U.S. Appl. No. 13/051,894, dated Dec. 12, 2014.
Notice of Acceptance for Invalidation from Chinese Appl. No. 200710148327.3, dated Jan. 27, 2015.
International Preliminary Report and Written Opinion from Appl. No. PCT/US2013/044277, dated Dec. 24, 2014.
Office Action from U.S. Appl. No. 13/770,389, dated Sep. 15, 2014.
International Search Report and Written Opinion from Appl. No. PCT/US2014/045888, dated Sep. 19, 2014.
Office Action from U.S. Appl. No. 13/051,894, dated Jun. 18, 2014.
Office Action from U.S. Appl. No. 13/649,067, dated Jul. 7, 2014.
Office Action from U.S. Appl. No. 13/649,052, dated Jul. 24, 2014.
Second Office Action from Chinese Patent Appl. No. 201210031021. 0, dated Jun. 4, 2014.
International Search Report and Written Opinion from PCT/US2013/062640, dated May 22, 2014.
International Preliminary Report on Patentability from PCT/US2012/028327, dated Oct. 3, 2013.
U.S. Appl. No. 11/656,789, filed Jan. 22, 2007 Chitnis, et al.
U.S. Appl. No. 11/899,790, filed Sep. 7, 2007, Chitnis, et al.
U.S. Appl. No. 11/473,089, filed Jun. 23, 2006, Tarsa, et al.
U.S. Appl. No. 12/463,709, filed May 11, 2009, Donofrio.
U.S. Appl. No. 13/034,501, filed Feb. 24, 2011 Le, et al.
U.S. Appl. No. 13/028,946, filed Feb. 16, 2011, Le, et al.
U.S. Appl. No. 13/368,217, filed Feb. 7, 2012, Pickard, et al.
U.S. Appl. No. 12/873,303, filed Aug. 31, 2010, Edmond, et al.
Cree® family of LED chip, DA, E2, GaN, MB, RT, TR, UT, and XT, printout from cree.com, 2 pages.
Bergguist Co. Chanhassen, Minn.. "T-Clad" overview product sheet, 3 pages.
Cree® XLampC family product info printout, from cree.com, 20 pages.
Cree® XLempXM product infor printout, from cree.com, 13 pages.
Cree® XLampMC product info printout, from cree.com, 14 pges.
Citizen Micro HumanTech, "OOB-High-wattage Series & Low-wattage Series", Short Form Lighting LED Catalog 2012, Citizen Electronics Co., Ltd. Japan. 7 pages.
Office Action from U.S. Appl. No. 13/051,894, dated Aug. 19, 2013.
Response to OA from U.S. Appl. No. 13/051,894, filed Oct. 21, 2013.
Defn. composite, Online Oxford Dictionary, <http://oxforddictionaries.com/us/defintion/american_english/composite?q=composite>.
Office Action from U.S. Appl. No. 13/040,088, dated Sep. 13, 2013.
International Search Report for PCT Patent Application No. PCT/US2012/028327, dated Nov. 23, 2012.
U.S. Appl. No. 12/475,261, filed May 2009, Negley, et al.
U.S. Appl. No. 13/770,389, filed Feb. 2013, Lowes, et al.
U.S. Appl. No. 13/804,309, filed Mar. 2013, Castillo, et al.
U.S. Appl. No. 12/002,429, filed Dec. 2007, Loh, et al.
U.S. Appl. No. 13/345,215, filed Jan. 2012, Lu, et al.
U.S. Appl. No. 11/818,818, filed Jun. 2007, Chakraborty, et al.
U.S. Appl. No. 11/895,573, filed Aug. 2007, Chakrahorty, et al.
U.S. Appl. No. 12/498,253, filed Jul. 2009, Le Toquin, et al.
U.S. Appl. No. 13/544,662, filed Jul. 2012, Tarsa, et al.
U.S. Appl. No. 13/842,307, filed Mar. 2013, Ibbetson, et al.
U.S. Appl. No. 13/306,589, filed Nov. 2011, Tarsa, et al.
U.S. Appl. No. 13/219,486, filed Aug. 2011, Ibbetson, et al.
Office Action from U.S. Appl. No. 13/040,088. dated May 7, 2013.
Response to OA from U.S. Appl. No. 13/840,088, filed Jun. 20, 2013.
Office Action from U.S. Appl. No. 13/051,894, dated Jan. 14, 2013.
Response to OA from U.S. Appl. No. 13/051,894, filed May 6, 2013.

(56) References Cited

OTHER PUBLICATIONS

International Search Report from PCT/US2023/044277, dated Jan. 7, 2014.
First Office Action from Chinese Patent Appl. No. 202210031021.0, dated Dec. 30, 2013.
U.S. Appl. No. 13/957,290, filed Aug. 1, 2013, Reiherzer, et al.
U.S. Appl. No. 14/286,344, Wilcox, et al.
Cree EZ9501 Gen 3 LEDs, Data Sheet, 6 pages, from ww.cree.com.

* cited by examiner

| Group | Die Area | Panel Area | Die to Panel Ratio | Comments |
|---|---|---|---|---|
| Single Chip | 1.1025 | 2.56 | 0.4307 | Conventional LED Packages < = 0.431 |
|  | 1.8225 | 6.25 | 0.2916 |  |
|  | 3.8025 | 12.25 | 0.3104 |  |
|  | 2.7225 | 6.25 | 0.4356 | Package According to Present Invention > 0.431 |
|  | 5.5225 | 12.25 | 0.4508 |  |
| Multi Chip | 8.41 | 25 | 0.3364 | Packages According to Present Invention > 0.18 |
|  | 15.21 | 49 | 0.3104 |  |
|  | 25.23 | 81 | 0.3115 |  |
|  | 8.41 | 49 | 0.1716 | Conventional LED Packages < = 0.18 |
|  | 12 | 81 | 0.1481 |  |

| Family | Substrate Area | Optical Area | LF/mm$^2$ of substrate at max (E7/BOCRI/85C) | LF/mm$^2$ optical area (dome only; E7/BOCRI/85C) |
|---|---|---|---|---|
| LED Packages According to Invention | 81 | 80.7 | 56 | 56 |
| | 49 | 44.4 | 69 | 76 |
| | 25 | 24.6 | 69 | 70 |
| | 12.25 | 11.9 | 115 | 119 |
| | 6.25 | 6.25 | 107 | 107 |
| Conventional LED Package | 81 | 52.8 | 19 | 29 |
| | 49 | 33.2 | 28 | 41 |
| | 25 | 16 | 32 | 50 |
| | 12.25 | 7.35 | 36 | 59 |
| | 6.25 | 6.25 | 68 | 68 |

LED PACKAGE WITH MULTIPLE ELEMENT LIGHT SOURCE AND ENCAPSULANT HAVING CURVED AND/OR PLANAR SURFACES

This application is a continuation of and claims the benefit of U.S. patent application Ser. No. 14/575,805, filed on Dec. 18, 2014, now U.S. Pat. No. 10,468,565, which claims the benefit of U.S. Provisional Patent Application No. 62/073,256, filed on Oct. 31, 2014. U.S. patent application Ser. No. 14/575,805 is also a continuation-in-part of U.S. patent application Ser. No. 13/770,389, filed on Feb. 19, 2013, which is a continuation-in-part of and claims the benefit of U.S. patent application Ser. No. 13/649,067, now U.S. Pat. No. 9,818,919, and U.S. patent application Ser. No. 13/649,052, now U.S. Pat. No. 9,048,396, both of which were filed on Oct. 10, 2012, and both of which claim the benefit of U.S. Provisional Patent Application Ser. No. 61/658,271, filed on Jun. 11, 2012, U.S. Provisional Patent Application Ser. No. 61/660,231, filed on Jun. 15, 2012, and U.S. Provisional Patent Application Ser. No. 61/696,205, filed on Sep. 2, 2012. Each of the applications cited in this paragraph are incorporated by reference as if fully set forth herein.

BACKGROUND OF THE INVENTION

Field of the Invention

This invention pertains to solid state light emitters and in particular to light emitting diode (LED) packages with one or more LEDs and a hybrid encapsulant comprising planar and curved surfaces.

Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, now U.S. Pat. Nos. 9,024,349 and 9,159,888, respectively, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089, now U.S. Pat. No. 8,563,339, to Tarsa et al. entitled "System For And Method For Closed Loop Electrophoretic Deposition of Phosphor Materials On Semiconductor Devices".

Another conventional LED package 30 shown in FIG. 3 comprises an LED 32 on a submount 34 with a hemispheric lens 36 formed over it. The LED 32 can be coated by a conversion material that can convert all or most of the light from the LED. The hemispheric lens 36 is arranged to minimize total internal reflection of light. The lens is made relatively large compared to the LED 32 so that the LED 32 approximates a point light source under the lens. As a result, the amount of LED light that reaches the surface of the lens 36 is maximized to maximize the amount of light that emits from the lens 36 on the first pass. This can result in relatively large devices where the distance from the LED to the edge of the lens is maximized, and the edge of the submount can extend out beyond the edge of the encapsulant. Further, these devices generally produce a Lambertian emission pattern that is not always ideal for wide emission area applications. In some conventional packages the emission profile can be approximately 120 degrees full width at half maximum (FWHM).

Lamps have also been developed utilizing solid state light sources, such as LEDs, in combination with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light to a different wavelength through a phosphor or other conversion material. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

SUMMARY OF THE INVENTION

The present invention is generally directed to emitter or LED packages that are compact and efficiently emit light, and can comprise encapsulants with planar surfaces that refract and/or reflect light within the package encapsulant. In some embodiments, the packages can also comprise a submount with one LED, while other embodiments can comprise a plurality of LEDs. In the single LED embodiments, a phosphor layer can cover the LED, and in multiple LED embodiments the phosphor layer can be on one or more of the LEDs. In both of these types of LED packages, the phosphor layer can also cover at least part of the submount. The encapsulant can be on the submount, over the LEDs, and over at least part of the phosphor. Some of the light reflected within the encapsulant, due, for example, to total internal reflection from planar or otherwise shaped encapsulant surface, will reach the phosphor layer, where it may be scattered or absorbed and converted and then emitted omnidirectionally. This allows for reflected light to now escape from the encapsulant. This allows for efficient emission and a broader emission profile, for example when compared to conventional packages with hemispheric encapsulants or lenses.

The present invention is also directed to features or arrangements that allow for improved and/or tailored emission characteristics for LED packages according to the present invention. Some of these features or arrangements include, but are not limited to, higher ratio of light source size to submount size, the used of particular materials (e.g. different silicones) for the LED package layers, improved arrangement of a reflective layer, improved composition and arrangement of the phosphor layer, tailoring the shape of the encapsulant, and/or improving the bonds between the layers. There are only some of the improvements disclosed herein, with some of these resulting in LED packages the emit light with a higher luminous intensity over conventional LED packages.

These and other aspects and advantages of the invention will become apparent from the following detailed description and the accompanying drawings which illustrate by way of example the features of the invention.

DETAILED DESCRIPTION OF THE INVENTION

Figure 1:
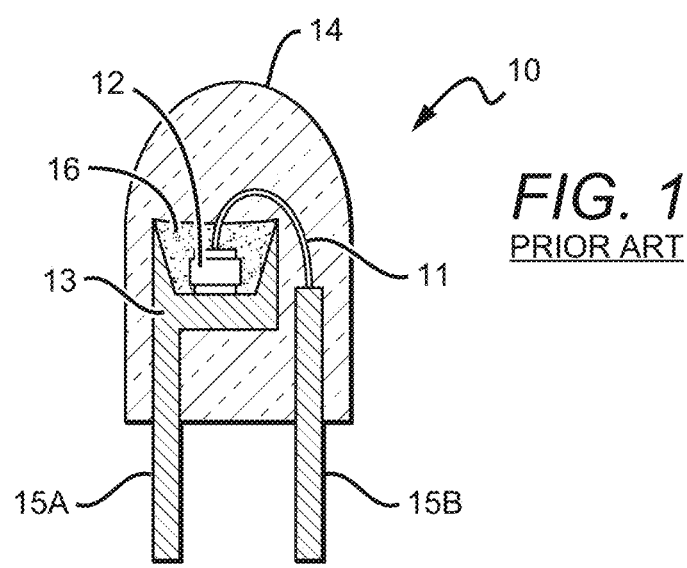
FIG. 1 shows a sectional view of one embodiment of a prior art LED package.
Figure 2:
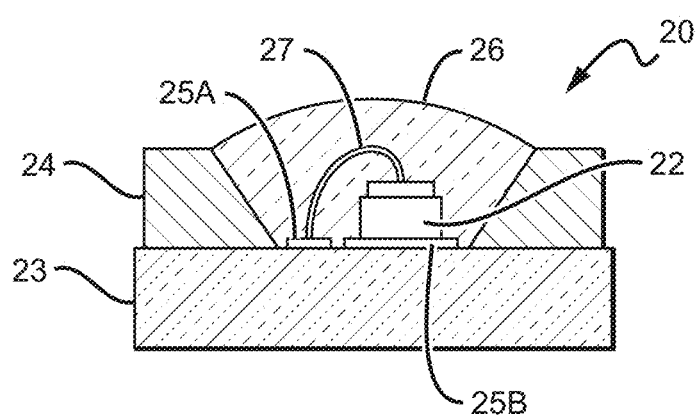
FIG. 2 shows a sectional view of another embodiment of a prior art LED package.
Figure 3:
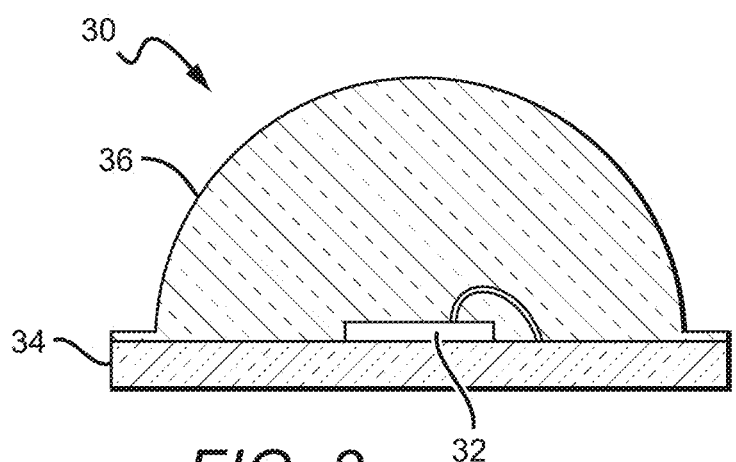
FIG. 3 shows a sectional view of still another embodiment of a prior art LED package.

The present invention is directed to different embodiments of LED package structures having a light source that comprises a single or plurality of LED chips. The LED packages can be arranged in different ways and are relatively small, while at the same time are efficient, reliable and cost effective. The embodiments according to the present invention have different shaped encapsulants, but can emit with improved or similar efficiency compared to similar LED packages with fully hemispheric encapsulants. The LED packages according to the present invention can also be smaller and less expensive to manufacture.

In some embodiments, the LED packages can have encapsulants with planar surfaces that result in a certain amount of light experiencing total internal reflection (TIR) within the encapsulant. Using planar surfaces can provide increased flexibility in the different shapes that can be used beyond conventional hemispheric lenses, that are typically arranged to minimize TIR light, and the use of planar surfaces can allow for more compact LED packages. Some embodiments can comprise one or more LEDs ("LED") on a submount with contacts and traces for applying an electrical signal to the one or more LEDs. The LED and the surface around the LED can be blanketed by a layer of phosphor material in some embodiments the encapsulant can comprise a transparent material that is in a cubic or generally cubic shape over the LED and the submount. The conversion material layer can be of the type that converts light from the LED to another color or wavelength of light, and the conversion layer can be of a thickness and concentration such that less than all of the LED light is converted on its first pass through the conversion material.

Different LED packages according to the present invention can have different shaped encapsulants to produce the desired emission profile and emission efficiency. Some embodiments can comprise encapsulants where not all of the surfaces are planar, with some comprising a hybrid combination of planar and curved surfaces. Some of these embodiments can comprise one or more LEDs mounted on a submount, with the encapsulant having an upper curved surface and planar side surfaces. The upper surface can have a radius of curvature that is greater than half the length or width of the submount, with the planar surfaces comprising truncated sections of the encapsulant so that the encapsulant does not overhang the edge of the submount. This can result in planar surfaces with a curved edge as described below. LED packages with planar encapsulants and planar/curved encapsulants are fully described in U.S. patent application Ser. No. 13/957,290, now U.S. Pat. No. 9,887,327, entitled "LED Package with Encapsulant Having Curved and Planar Surfaces," which is incorporated herein by reference.

The present invention is directed to a number of different features and arrangement that can improve or tailor the emission characteristics of LED packages according to the present invention. These can include, but are not limited to, improved phosphor layer compositions and coverage, the use of particular silicones in different layers, the grouping of LED chips, a truncated (or cubic) encapsulant, and/or improved coverage of reflective layers. In some embodiments, the use of some or all of these features can result in LED packages emitting light at improved lumen density.

The present invention is described herein with reference to certain embodiments, but it is understood that the invention can be embodied in many different forms and should not be construed as limited to the embodiments set forth herein. In particular, the present invention is described below in regards to certain LED packages having LEDs in different configurations, but it is understood that the present invention can be used for many other LED packages with other LED configurations. The LED packages can also have many different shapes beyond those described below, such as rectangular, and the solder pads and attach pads can be arranged in many different ways. In other embodiments, the emission intensity of the different types of LED chips can be controlled to vary the overall LED package emission.

The present invention can be described herein with reference to conversion materials, wavelength conversion materials, remote phosphors, phosphors, phosphor layers and related terms. The use of these terms should not be construed as limiting. It is understood that the use of the term remote phosphors, phosphor or phosphor layers is meant to encompass and be equally applicable to all wavelength conversion materials.

The embodiments below are described with reference to an LED or LEDs, but it is understood that this is meant to encompass LED chips, and these terms can be used interchangeably. These components can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 4:
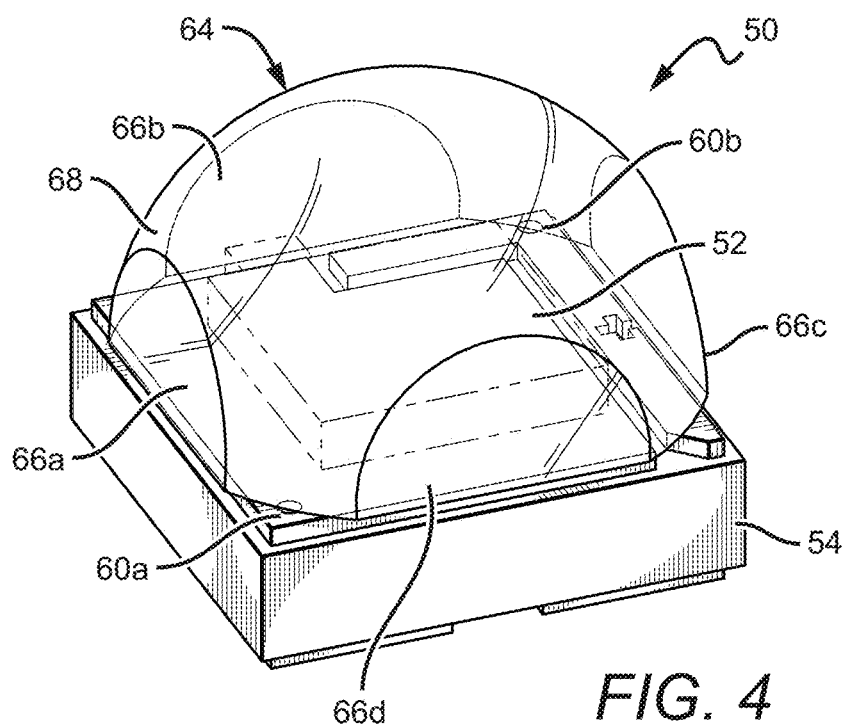
FIG. 4 is a perspective view of one embodiment of an LED package according to the present invention.
Figure 5:
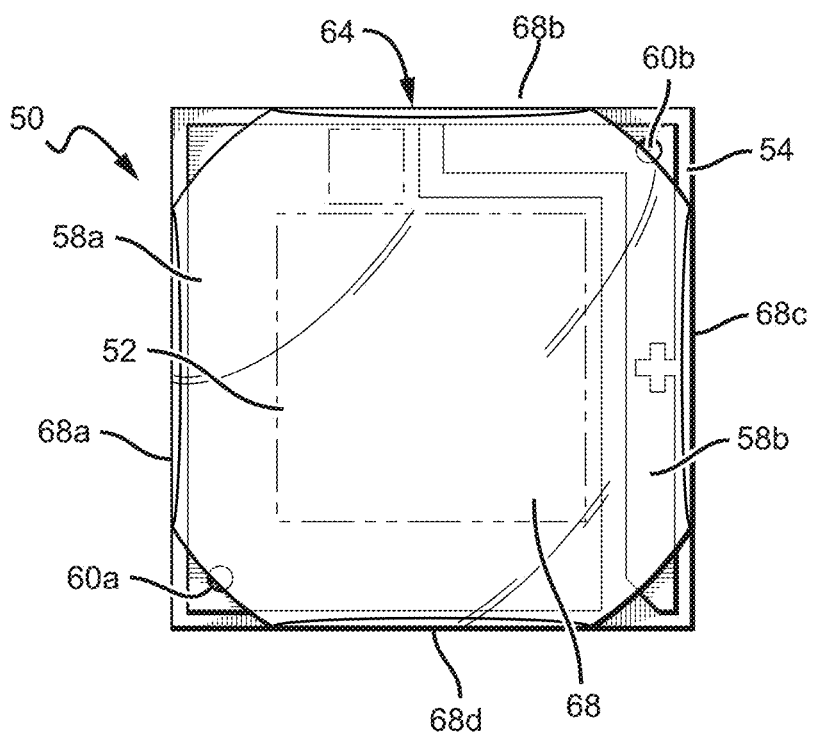
FIG. 5 a top view of the LED package shown in FIG. 4.
Figure 6:
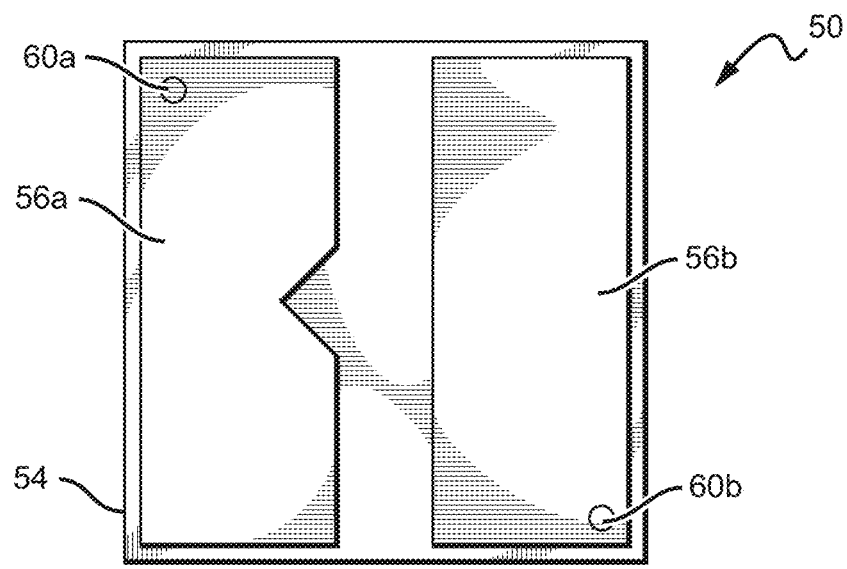
FIG. 6 is a bottom view of the LED package shown in FIG. 4.

FIGS. 4-6 show one embodiment of an LED package 50 according to the present invention having a single emitter and an encapsulant with curved and planar surfaces. This is only one of the many different LED packages that can use the features of the present invention and the features are described in U.S. patent application Ser. No. 13/957,290, now U.S. Pat. No. 9,887,327, which is incorporated above. The package 50 has a generally square footprint and can comprise an LED chip 52 mounted on a submount 54. The LED package 50 also comprises first and second bottom contact/solder pads 56a, 56b on the bottom of the submount 54. First and second die attach pads 58*a*, 58*b* can be included on the top surface of the submount 54 and first and second conductive vias 60*a*, 60*b* are included that pass through the submount 54 between the die attach pads 58*a*, 58*b* and the solder pads 56*a*, 56*b*. The LED chip 52 and submount 54 can comprise any of the devices and materials described above, and can be arranged in many different ways. The pads and vias can similarly be made of different materials be arranged in the different way as those described in the incorporated patent application.

Some embodiments of the LED package can further comprises a conversion material layer (not shown) described below that covers the LED chip 52, and in some embodiments the conversion material layer can also cover the exposed surfaces of the die attach pads 58*a*, 58*b*, and exposed portions of the top surface of the submount 54. An encapsulant 64 is included over the LED chip 52, the attach pads 58*a*, 58*b*, and the submount 54. The conversion material layer can comprise any of the materials described in the above incorporated application, and can be arranged in the different ways described therein. The encapsulant 64 can also comprise any of the materials described therein.

In LED package 50, the encapsulant 64 does not comprise only planar surfaces, but comprises a combination of planar and curved surfaces. The embodiment shown comprises four side planar surfaces 66*a-d* and one curved surface 68, with the side planar surfaces being in alignment with the edges of the submount 54 and the remainder of the outer surface of the encapsulant 64 comprising the curved surface 68. The encapsulants according to the present invention can comprise different curved and planar surfaces that can provide the desired package emission profile, such as a narrow package emission profile compared to packages with cubic encapsulants. The encapsulant can also provide the desired variation in CCT over a range of viewing angles.

The encapsulants according to the present invention can have many different dimensions of planar and curved surfaces as described in the above application. This combination of planar and curved surfaces allows for the LED package 50 to maintain its relatively small footprint, while also utilizing a encapsulant with a larger radius of curvature. In some embodiments, less light experiences TIR at the curved surface, thereby reducing the amount of light recycling compared to LED packages with cubic encapsulants. Some light may experience TIR at the planar surfaces, but there can be an overall reduction in TIR that can contribute to the LED package emitting more of a focused or narrow emission profile.

Figure 7:
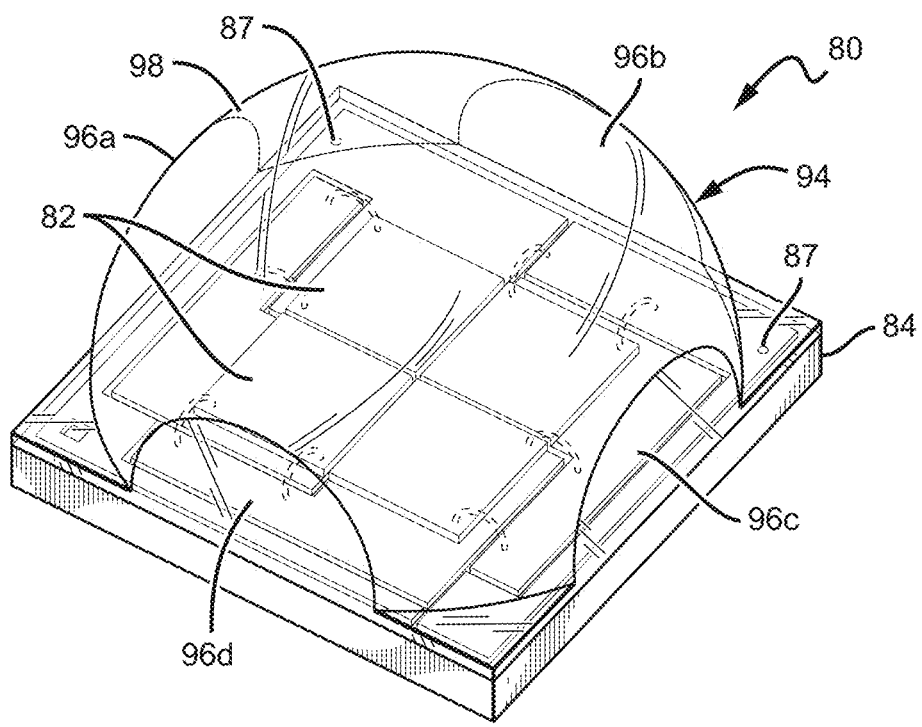
FIG. 7 is a perspective view of another embodiment of an LED package according to the present invention.
Figure 8:
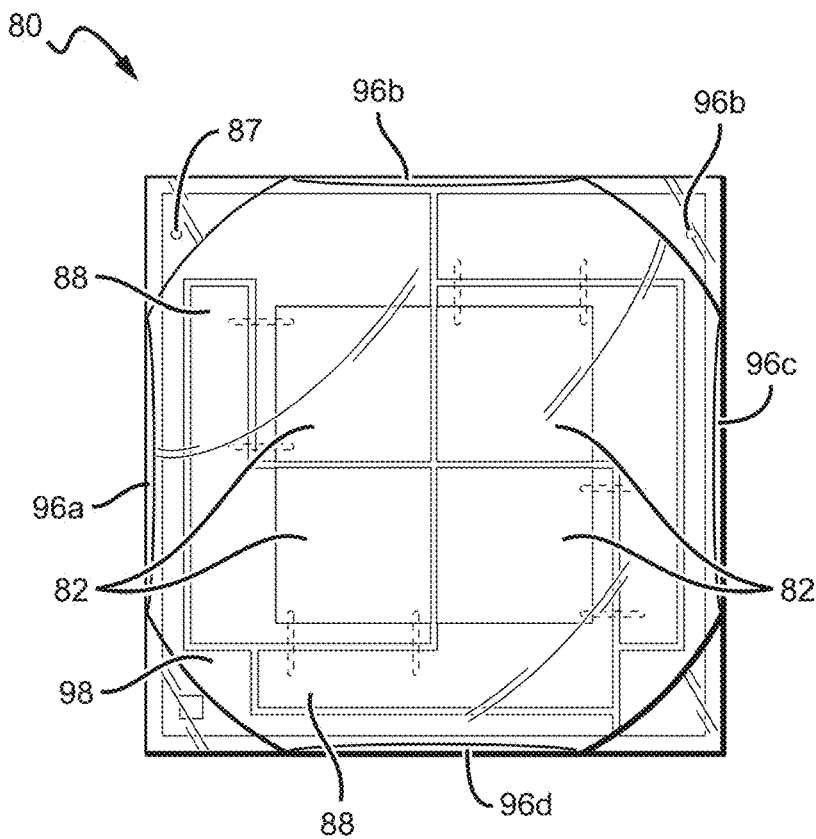
FIG. 8 a top view of the LED package shown in FIG. 7.
Figure 9:
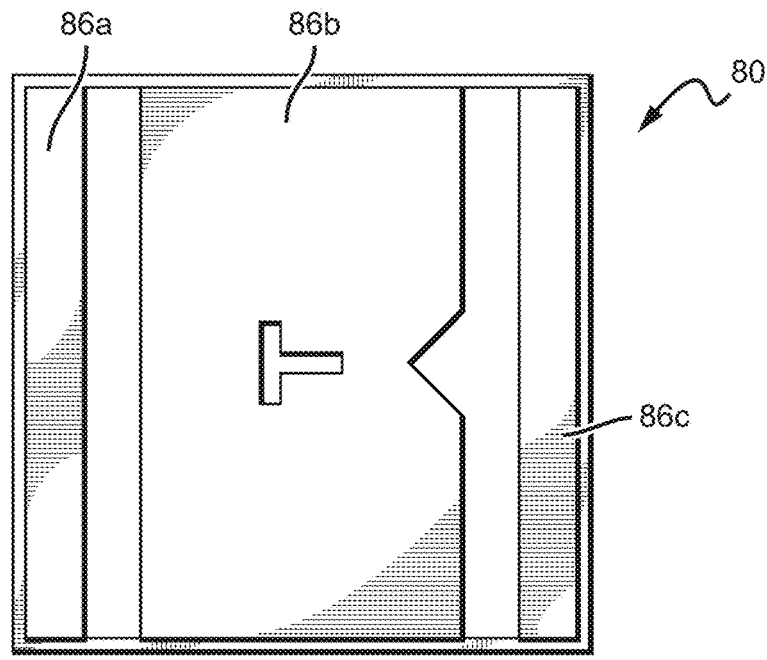
FIG. 9 is a bottom view of the LED package shown in FIG. 7.

FIGS. 7-9 show another embodiment of an LED package 80 according to the present invention that also comprises a submount 84, with bottom contacts 86*a-c* and conductive vias 87. The LED package also includes an encapsulant 94 with planar surfaces 96*a-d* and a curved surface 98. In this embodiment, the LED package 80 comprises a plurality of LEDs 82 with a corresponding increase in the number of die attach pads 88. The embodiment shown comprises four LED chips 82 and four or more die attach pads 88. LED chips 82 can be used including commercially available chips such as the EZ family chips available from Cree, Inc. Other LED chips can also be used including those commercially available from Cree Inc., under its DA, GaN, MB, RT, TR, UT and XT families of LED chips. The LED package 80 can also comprise a conversion material layer (not shown) as described below. It is understood that the present invention can be applied to many different LED packages beyond those shown in the embodiments above, or shown in the above incorporated application.

The present invention provides improvements over previously disclosed LED packages with planar surface encapsulants. One of the advantages of LED packages according to the present invention is that they can have relatively large epitaxial (LED chip die) area per substrate (submount or panel) area. The different LED package embodiments of the present invention can comprise encapsulants or domes with many different shapes and sizes, with some embodiments having truncated or cubic lenses. This truncated encapsulant arrangement, along with the type and size of emitters, allows for higher die area (i.e. the area covered by the emitter die) to panel area (i.e. the area covered by the LED chip submount or panel) ratios compared to conventional LED chips. That is, the die area for the LED packages according to the present invention can cover more of the top surface of the submount/panel compared to conventional LED packages.

Figures 10, 11:
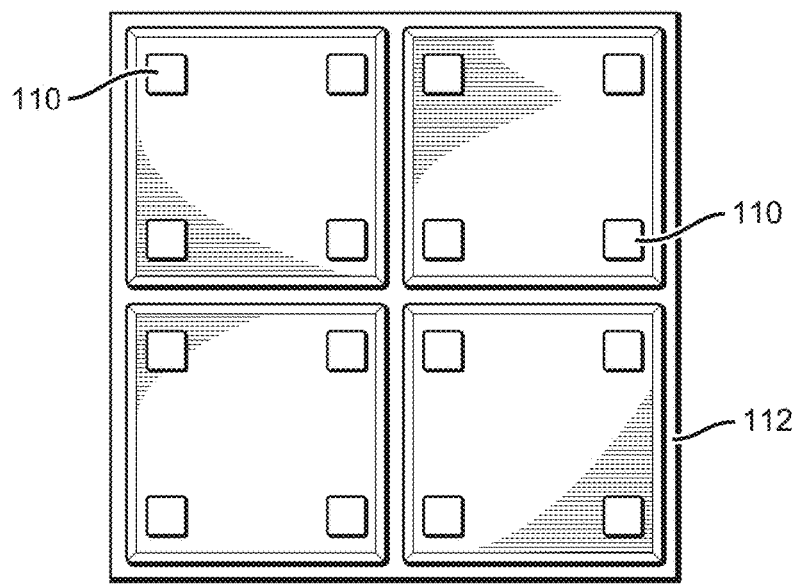
FIG. 10 is a top view of multiple LEDs that can be used in LED packages according to the present invention.
FIG. 11 is table showing the die to submount area ratios for conventions LED packages compared to LED packages according to the present invention.

The present invention also provides for a number of improvements, including but not limited to improved die to panel ratios and improved phosphor coverage of adjacent LED chips in the LED packages having multiple LED chips. FIG. 10 shows one embodiment of the arrangement of four LED chips 110 that can be provided on a submount/substrate 112 in some LED packages according to the present invention. Different LED chips can be used including commercially available chips such as the EZ family chips available from Cree, Inc., each of which can have two wire bond pads for electrical connection by wire bonds. Other LED chips can also be used including but not limited to those commercially available from Cree Inc., under its DA, GaN, MB, RT, TR, UT and XT families of LED chips.

FIG. 11 is a table 120 showing the die to submount (also referred to as substrate or panel) area ratios for different LED package types according to the present invention, compared to conventional LED chips. For conventional single LED chip packages 122, the ratio of die area to panel area ratio can be less than 0.430. For some embodiments of single chip LED packages 124 according to the present invention, the ratio of die to submount area can be greater than 0.431. In other embodiments, the ratio can be greater than 5, while in other embodiments it can be greater than 6 or 7. Referring again to FIG. 11, for conventional multichip LED packages 126 the die to submount area ratio is typically less than 0.18. For multiple chip LED packages according to the present invention 128, the die to submount area ratio can be greater than 0.18. In other embodiments the ratio can be greater than 2 or greater than 3, while in other embodiments the ratio can be greater than 4. Different factors can contribute to the improved ratios, including but not limited to the truncated lens with planar surfaces.

Figure 12:
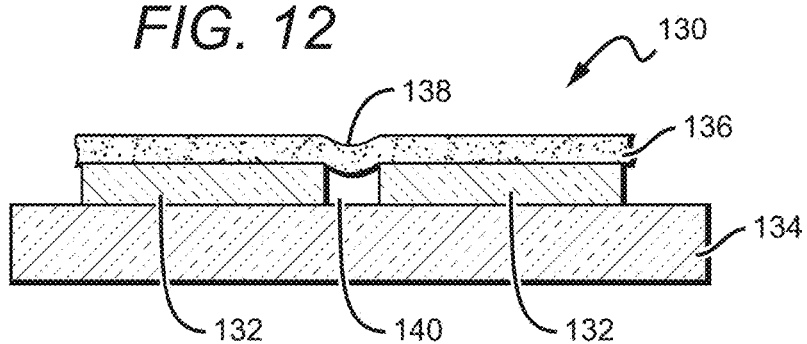
FIG. 12 is a side view of an embodiment of an LED package according to the present invention.
Figure 13:
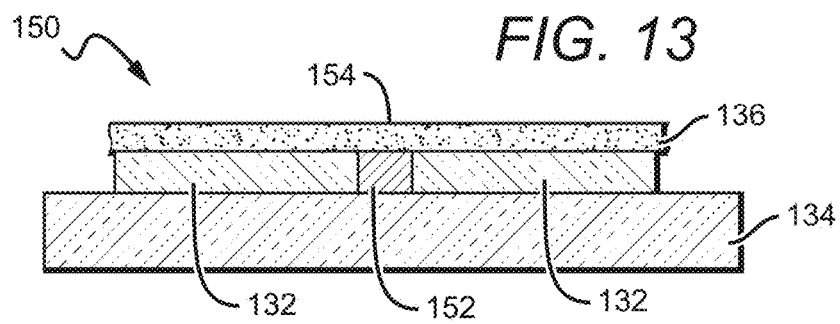
FIG. 13 is a side view of another embodiment of an LED package according to the present invention.
Figure 14:
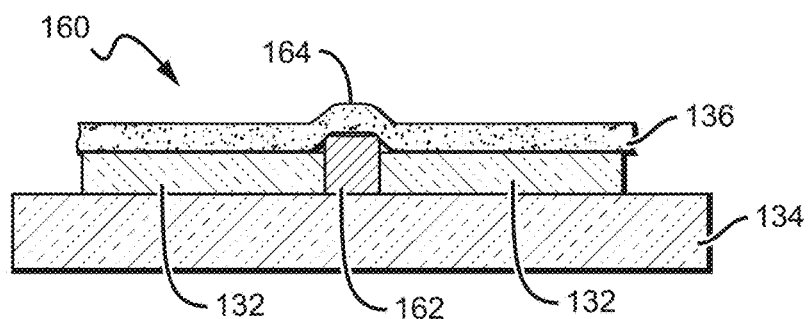
FIG. 14 is a side view of still another embodiment of an LED package according to the present invention.

FIGS. 12-14 show different embodiments according to the present invention providing improved coverage of the phosphor layer between adjacent ones of the LED chips. In these embodiments the phosphor layer can span the space between adjacent ones of the LED chips. Referring first to the embodiment shown in FIG. 12, an LED package 130 is shown comprising a LED chips 132 mounted on a submount 134. A phosphor layer 136 is included that is dispensed over the LED chips 132 and then cured. It is understood that an encapsulant would be included as described above, but is not shown for ease of description. In the embodiment shown, that phosphor layer 136 forms a bridge 138 over the gap between adjacent ones of the LED chips 132, leaving an air gap 140 between adjacent ones of the LED chips 132 and below the phosphor layer 136. The bridge 138 can remain intact following deposition and curing of the phosphor layer 136. The viscosity of the phosphor layer 136 helps form and maintain the bridge 138, with the some embodiments comprising dispensed phosphor layer having a viscosity in the range of 1-75 Pa·S. Other embodiments can comprise a dispensed layer with a viscosity of in the range of 25-75 Pa·S, while others can comprise a viscosity in the range of 50-75 Pa·S. The phosphor bridge 138 provides a greater amount of phosphor material that is in the direct optical path and can be illuminated by light from the LED chips compared to conventional LED packages not having phosphors between the LED chips or having phosphor layers that conform to the LED chips and cover the space between the LED chips.

In some embodiments, the phosphor layer 136 as described above with LED chip 130 may experience a slight dip during curing as the result of gravity drawing the phosphor layer between the LED chips 132. FIG. 13 shows another embodiment of an LED package 150 according to the present invention having many of the same or similar features as LED package 130 described above. For those same or similar features, the same reference numbers are used herein and in the embodiment described below. The LED package 150 comprises LEDs 132 mounted on a submount 134, with a phosphor layer 136 over the LEDs 132. To reduce or eliminate this dip in the phosphor layer, an infill or filler material 152 can be included between the LED chips 132. In the embodiment shown, the filler material fills the gap and has a top surface that is at substantially the same height as the top surface of the LED chips 132. This allows for the phosphor layer to be deposited and cured, and for the phosphor layer to remain flat across the LED chips 132 and the space between the LED chips 132. Stated differently, the phosphor layer bridge 154 remains at the same height as the remainder of the phosphor layer 136. This can allow for even more phosphor to be in the direct optical path and illuminated by LED light.

Different filler materials can be used such as silicones, epoxies or other similar materials. In some embodiments, the filler material can be reflective by including reflective particles ($TiO_2$ or $ZrO_2$) mixed in a silicone or epoxy. In one embodiment the infill material can comprise $TiO_2$ mixed in silicone. In other embodiments the fill material can comprise separately molded pieces that can be inserted in the space between the LED chips before deposition of the phosphor layer. These separately molded pieces can comprise many different materials, such as polyphthalamide (PPA, High Performance Polyamide).

FIG. 14 shows another embodiment of an LED package 160 according to the present invention that is arranged to further increase the direct interaction of LED chip light with the phosphor material in spaces between the LED chips. The LED package 160 comprises LEDs 132 mounted on a submount 134, with a phosphor layer 136 over the LEDs 132. A filler material 162 can be included between the LED chips 132 and in this embodiment, the thickness of the filler material 162 can be increased so that its top surface is above the top surface of the LED chips 132. This can result in the phosphor layer bridge 164 between the LED chips being above the plane of the LED chips 132 so that more of the phosphor is in the direct optical of light from the LED chips 132. This can increase the amount of phosphor being illuminated by the LED chips. The filler can comprise any of the materials and can be arranged in any of the ways described above.

Different embodiments of the present invention can have the phosphor layers that are deposited as a sprayed coating with relatively high percentage of one or more solvents. The solvents can then be evaporated away (such as by heat or air drying) to leave the desired phosphor and binder layer. The resulting phosphor layer can have a relatively high phosphor to binder ratio, with some embodiments having a ratio of 2 to 1, 3 to 1, 4 to 1 or greater than 4 to 1. In the embodiments shown in FIGS. 12-14 the ratio can be approximately 4 to 1. This results in a high density phosphor layer on the LED chips, with a corresponding interconnecting high density phosphor layer (i.e. bridge) between the multiple LED chips.

The high density phosphor layer can provide the further advantage of improved thermal management for the LED packages according to the present invention. The high density phosphor layer can be a half, a third, or less than the thickness of lower density phosphor layers. For example, some embodiments of LED chips can have a high density layer in the range of 40 to 50 µm thick, while lower density layers can be in the range of 120 to 150 µm thick. By having a thinner phosphor layer with dense phosphor material, less heat is trapped in the phosphor layer and more heat generated by the phosphor can more easily radiate into the die or submount where is can dissipate.

Figure 15:
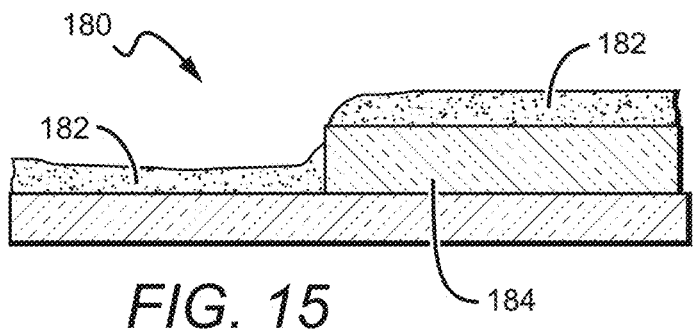
FIG. 15 is a side view of a conventional LED package.
Figure 16:
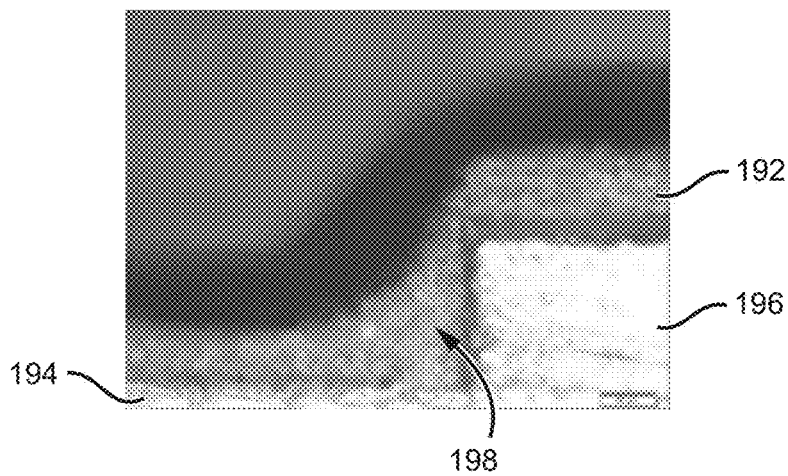
FIG. 16 is a side view of an LED package according to the present invention.
Figure 17:
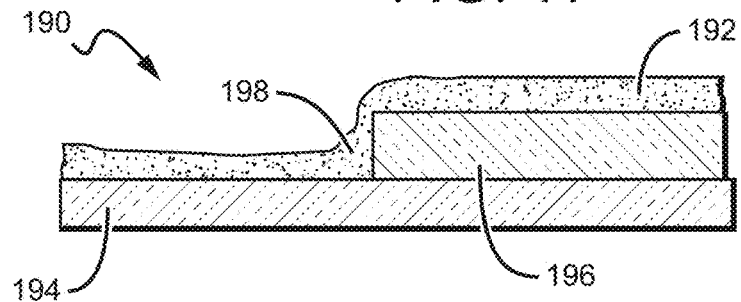
FIG. 17 is a side view of another LED package according to the present invention.
Figure 18:
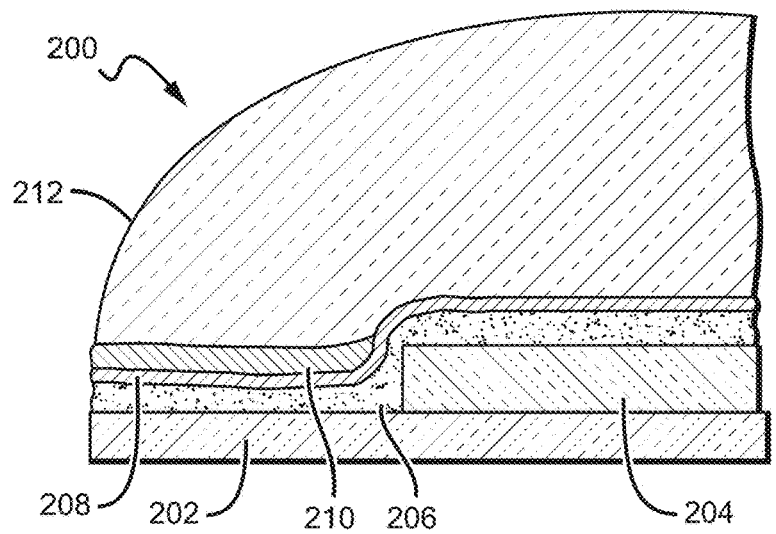
FIG. 18 is a side view of still another LED package according to the present invention.

The present invention also provides for more controlled and reliable formation of phosphor layers. As shows in FIG. 15 shows a conventional LED package 180 with a the phosphor layer 182 that can be interrupted at the edge of the LED chip 184 with the edge of the LED chip protruding partially or fully through the phosphor layer 182. FIGS. 16 and 17 show another embodiment of an LED package 190 according to the present invention that comprises a phosphor layer 192 having a smooth surface that creates a ramp from the submount 194 to the top surface LED chip 196. This ramp forms a "fillet" portion 198 of the phosphor layer 192 at the corner of the submount 194 and LED chip 196 that forms to the top of the chip. This fillet portion 198 provides more uniform phosphor layer coverage over the LED chip 196 and can be useful in the controlled formation of a reflective layer (as shown in FIG. 18 below). The smooth surface also allows for the surface tension to hold the reflective layer material (e.g. $TiO_2$ in silicone) to prevent it from covering the LED chip.

In conventional LED packages having a rough surface with large variations in surface topology, small openings between the surface features can promote wicking of the reflective layer material. This wicking can cause the reflective layer to cover the phosphor layer and to continue to cover the top of the LED chip where it can interfere with emission. In some embodiments according to the present invention, these rough surfaces can be made smooth using a spray/dispense of a silicone/solvent mixture deposited over the roughened surface. After cure, the top surface of the silicone layer will be smooth and helps reduce the reflective layer material wicking. This helps prevent the reflective layer from covering the LED chips.

FIG. 18 shows one embodiment of an LED package 200 with this additional smoothing layer that can comprise many different materials, with a suitable material being silicone based as described above. The LED package 200 can comprise a submount 202, with an LED chip 204 mounted on the submount's top surface. As described above, many different LED chips can be used with the embodiment shown comprising a blue emitter such as a blue emitting EZ LED chip from Cree, Inc. A silicone phosphor matrix layer 206 is included over the LED chip 204 and the top surface of the submount 202, with the phosphor layer 206 comprising a phosphor material and binder such as methyl silicone "A". A smoothing silicone layer 208 can be included over the phosphor layer 206 that can also comprise methyl silicone "A". The thickness of the smoothing layer 208 can be between 0 and 30 mm, but layers of other thicknesses can also be used. This smoothing layer 208 can be arranged between the phosphor layer 206 and reflective layer 210, as well as between the phosphor layer 206 and the encapsulant (molding layer) 212. In some embodiments it comprises the same silicone as the phosphor layer 206, and in other embodiments it can comprise a different silicone. The reflective layer 210 is included between the smoothing layer 208 and the encapsulant 212, and in this embodiment the reflective layer 210 can comprise $TiO_2$ mixed in silicone. Different silicones can be used, with some embodiments comprising phenyl silicone "1". The encapsulant (lens or dome) 212 is formed over the reflective layer 210 and the exposed smoothing layer 208. In some embodiments the encapsulant 212 can be formed by an overmold process and in some embodiments it can comprise a methyl silicone "B". In the embodiment shown the encapsulant 212 does not comprise the same silicone as the phosphor layer 206 or smoothing layer 208, but in other embodiments it can comprise the same silicone.

Figure 19:
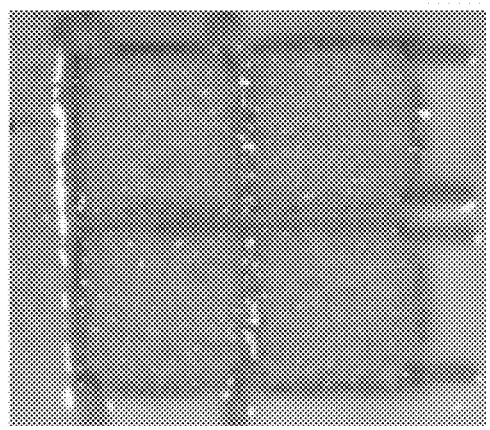
FIG. 19 is a top view of a conventional LED package.
Figure 20:
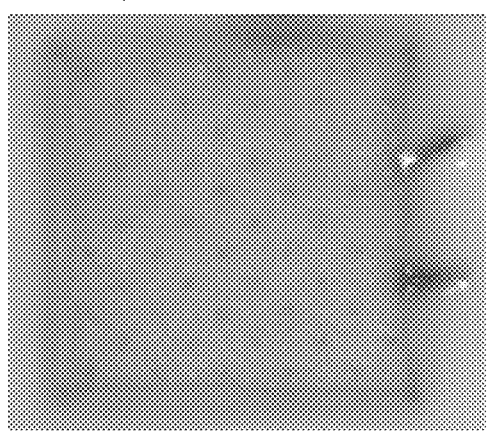
FIG. 20 is a top view of an LED package according to the present invention.

Silicone mismatch between the phosphor layer 206 and the reflective layer 210 also helps control wicking. Using silicones within the same functional groups can cause the reflective layer 210 to spread over the entire surface, including the top surface of the LED chip 204. Functional group mismatch can cause inhibition of the wicking, which allows silicone in the reflective layer 210 to run up to the sidewall of the LED chip 204 and not flow on top of the chip. FIG. 19 shows one embodiment of an LED package 220 where the silicones are matched and FIG. 20 shows one embodiment an LED package 230 where the silicones are mismatched. In some embodiments such as the embodiment shown in FIG. 18, phenyl silicone can be used for the reflective layer 210 and a methyl silicone can be used for the phosphor layer and the encapsulant 212.

The present invention comprises other methods for providing the desired spread and wicking of the reflective layer. As mentioned above, roughness of the phosphor layer can promote undesirable wicking. When dispensing material (e.g. phosphor layer material) on a heated stage, solvents can flash boil. This can leave a rough surface. Dispensing this same material on a cold stage and then curing, creates a smooth surface that allows for better control of the reflective material ($TiO_2$ mixed silicone). This allows for controlling the coverage of the reflective layer, particularly when depositing higher solvent ration phosphor layers.

Plasma treating the surface of the phosphor layer can also allow for better wetting of the reflective layer ($TiO_2$/silicone layer). The silicone mismatch limits the reflective layer wicking to uniformly cover the die edges, but removing statically attached compounds also allows the reflective layer material to flow to cover the chip edges. Other features such as the wire bonds can also facilitate wicking. As the reflective layer mixture spreads across the surface of the phosphor layer features, like wires or die edges promote wicking around the feature which can help direct the reflective layer material to cover the desired surface. Many different viscosities for the reflective layer and as discussed above, the reflective layer can comprise many different materials. In some embodiments the reflective layer that is deposited on the phosphor layer can comprise a $TiO_2$/silicone/solvent having a viscosity in the range of 25-100 Pa·s.

Embodiments of the present invention can also be arranged to provide more reliable bonding or coupling of the layers to provide a more reliable LED package. In some embodiments, a more robust and reliable chemical bond can be formed between layers. This can result in an improvement over conventional packages where the layers can more easily be separated from each other, such as in the case where they break cleanly from one another. Different processes can be used to create this chemical layer bond, with some embodiments allowing for the formation of one layer over another before one or more of the layers below are fully cured.

This chemical bond can be formed between many different layers in LED packages according to the present invention. In some embodiments, a reflective layer can be included over a portion of the LED package, such as over the phosphor layer around and/or between the LED chips. Referring again to the LED package 200 shown in FIG. 18, the reflective layer 210 can comprise many different materials, such as $TiO_2$ in silicone. The molded encapsulant 212 can then be formed over the top surface of the phosphor layer 206 and the reflective layer 210, with a chemical bond between the encapsulant 212 and reflective layer 210. In some embodiments this chemical bond can be formed by molding the encapsulant 212 over the reflective layer 210 before the silicone in the reflective layer 210 is fully cured. This arrangement is particularly applicable to layers having different types of silicone. For example, this arrangement can be used when one layer comprises a phenyl silicone and the other comprises a methyl silicone. In some embodiments, the reflective layer 210 can comprise $TiO_2$/silicone with a phenyl silicone while the encapsulant 212 can comprise a methyl silicone. To form a chemical bond between the two, the methyl silicone encapsulant 212 can be bonded over the reflective layer 210 before the phenyl silicone is cured. It is understood that other embodiments can comprise different types of materials in the different layers and in some embodiments the reflective layer 210 can comprise methyl silicone and the encapsulant 212 can comprise phenyl silicone.

Figure 21:
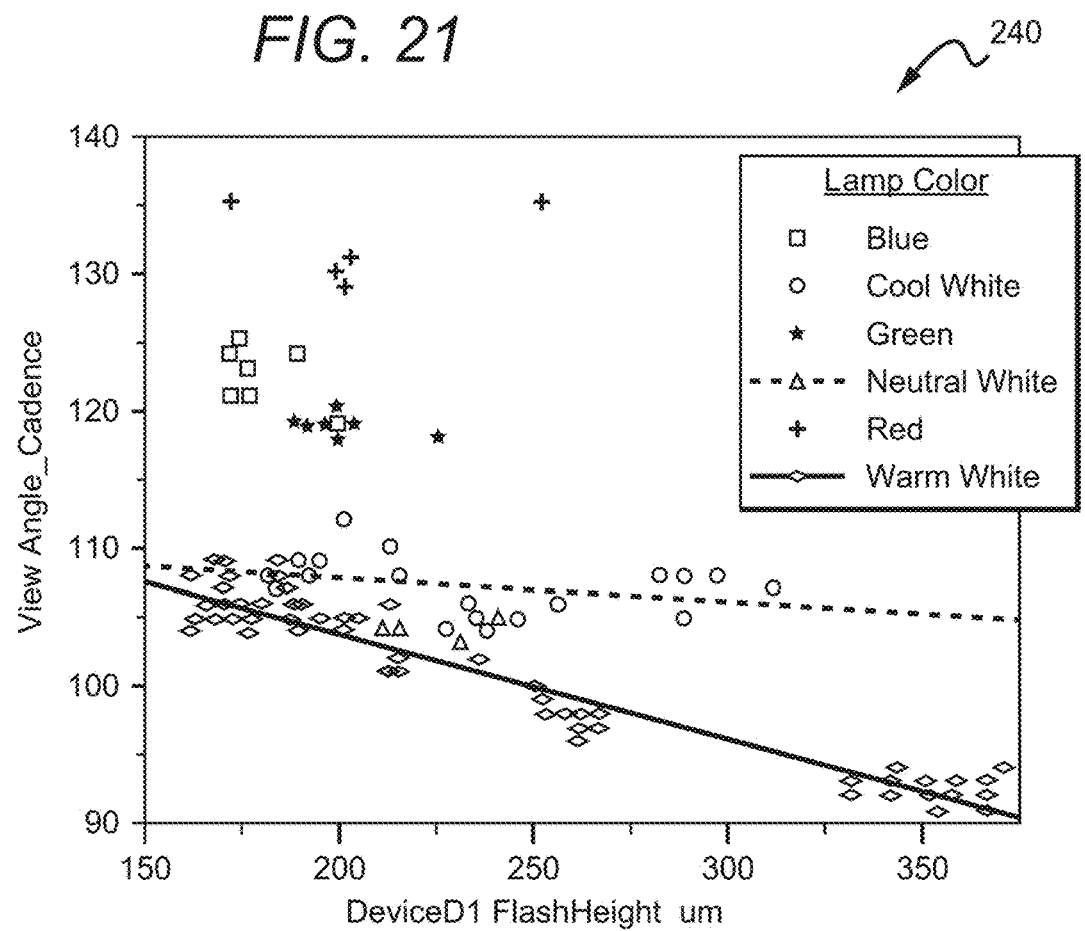
FIG. 21 is a graph showing the emission characteristics of different LED packages according to the present invention, at different flash heights.

Referring to FIGS. 4-9, the encapsulants 64, 94 in the different embodiments can include a portion at the corners of the submount that remains from the encapsulant overmold process. This corner portion of the encapsulant is referred to as the "flash" portion, and different embodiments can have a different flash height or thickness. In some embodiments, increasing the flash height can increase the distance from the LED chips emitting surface to the center of the lens, which can change the LED package emission pattern. Generally speaking, the farther the emitting surface is from the center of the lens the smaller the viewing angle. The inverse is also generally applicable, and the closer the emitting surface is to the center of the lens the greater the viewing angle. Brightness is also a function of flash height and generally the thinner the flash height the brighter the part will measure. In different embodiments, the flash height can be optimized to obtain proper viewing angle without sacrificing too much brightness. FIG. 21 is a graph 240 showing the different emission characteristics for one embodiment of an LED package according to the present invention with different flash heights, and in particular the warm and cool white emissions based on flash height. This is only one of the many encapsulant dimensions that can be changed to alter package emission characteristics.

Figures 22, 23:
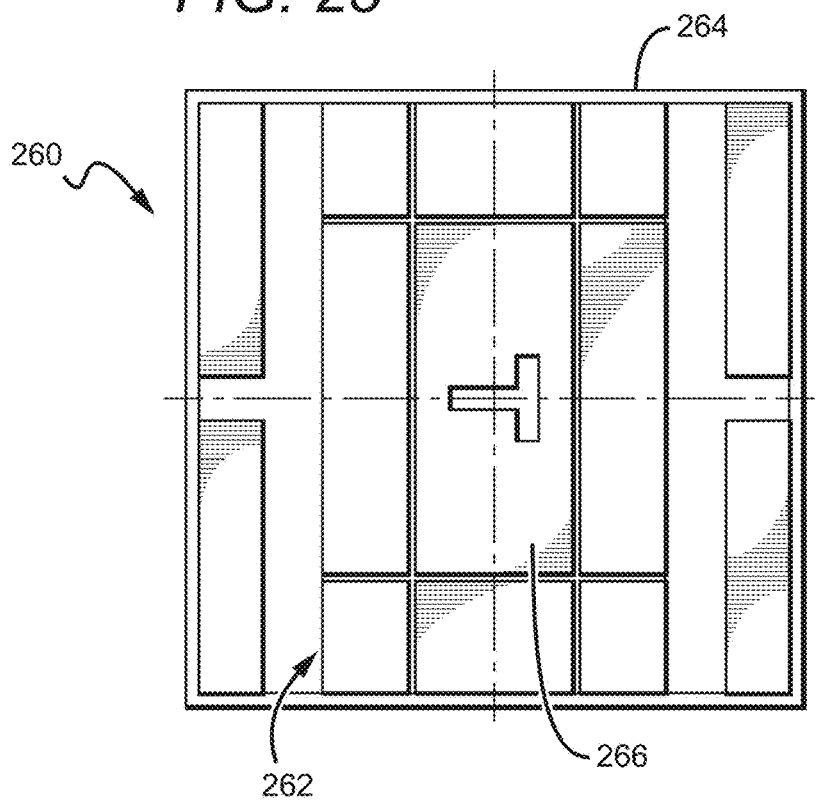
FIG. 22 is a graph showing luminous intensity of conventional LED packages and LED packages according to the present invention.
FIG. 23 is a bottom view of an LED package according to the present invention.

One, some or all of the different features described can be utilized in LED package embodiments according to the present invention. By utilizing the features described above such as the particular silicones in different layers (e.g. methyl for phosphor layer and encapsulant), the grouping of LED chips (four as shown), and the dense phosphor layer, the different embodiments can provide improved lumen density per submount and/or optical area. There can be many different classes of emission density at a particular maximum current. FIG. 22 shows a graph 250 that divides different LED packages according the present invention into three general classes based on light source size:

1. For source sizes greater than 49 mm$^2$, the lumen density can be in excess of 50 lm/mm$^2$. Conventional similar LED packages with same source sizes do not exceed 35 lm/mm$^2$.
2. For source sizes between 25 and 49 mm$^2$, the lumen density can be excess of 70 lm/mm$^2$. Conventional similar LED packages with the same source sizes do not exceed 50 lm/mm$^2$.
3. For source size less than 25 mm$^2$, lumen density can be greater than 100 lm/mm$^2$. Conventional similar LED packages with the same source size did not exceed 70 lm/mm$^2$.

It is understood that these devices can be divided into many other classes. Some of these embodiments can use a truncated (or cubic) dome, which allows for the substrate and encapsulant (dome) to have nearly the same size and/or footprint. Conventional technologies can use a full dome that is smaller than the substrate area. This can be one factor in the difference of lumen density with convention LED packages.

Some conventional LED packages are arranged to allow for operation at different voltages, such as at 6 v/12V operation. Embodiments of the present invention can also be arranged to operate at additional voltages, such as at 18/36V operation, and can be arranged to operate at more than two voltages. Some of these embodiments can use multiple solder points to improve thermal performance by reducing solder voids. FIG. 23 shows another embodiment of an LED package 260 according to the present invention that can comprise a waffle like contact pattern (grid of many small squares) 262 on the bottom surface of the submount 264 with no solder mask in between for the center thermal pad 266. In this embodiments the center thermal pad 266 is neutral, however it has multiple pads without solder mask between them that can provide for channels of flux to boil off during solder reflow. This can help reduce the void formations that are common in large solder footprints. The channels in this embodiment can be 20-100 um wide and can be the full depth of the metal. In other embodiments, the channels do not need to be the full depth.

Additionally, the embodiments comprise improved ratio of substrate to metallization. Conventional substrates are 0.5 mm thick with 0.06 mm Cu on the back (and top). This has a nominal backside metal thickness to substrate thickness ratio of 8.3. In different embodiments according to the present invention the backside metal thickness to substrate thickness can be the range of 1 to 6. In some embodiment, the substrate/submount can be 0.385 mm thick substrate, with a metal thickness of least 0.06 mm Cu (perhaps 0.07 or 0.08) to improve thermal performance. FIG. shows one embodiment of a base material 280 (substrate or submount), with topside and backside metallization 282, 284, along with a graph 286 showing different thicknesses for the layers.

Figure 25:
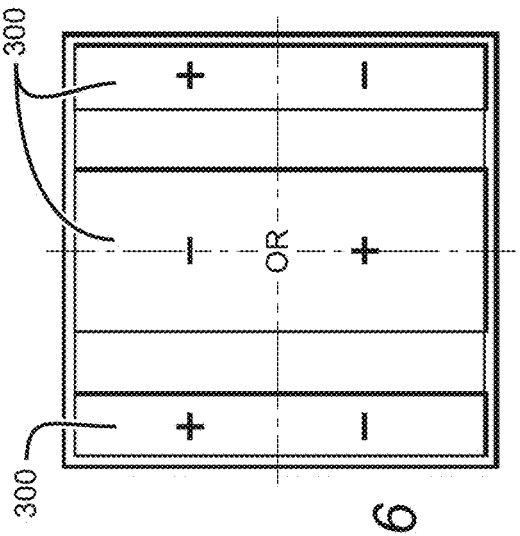
FIG. 25 is a bottom view of a conventional LED package.
Figure 26:
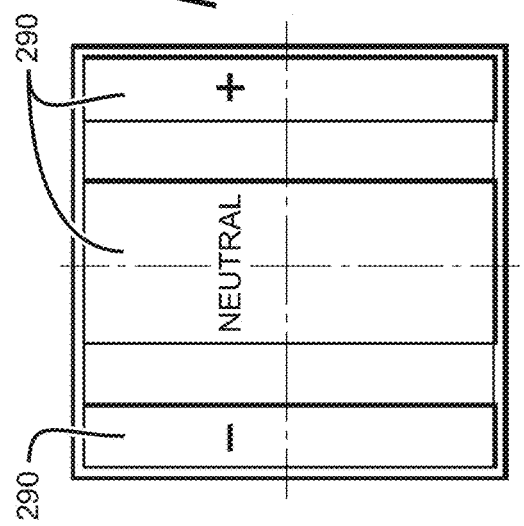
FIG. 26 is a top view of an LED package according to the present invention.
Figure 24:
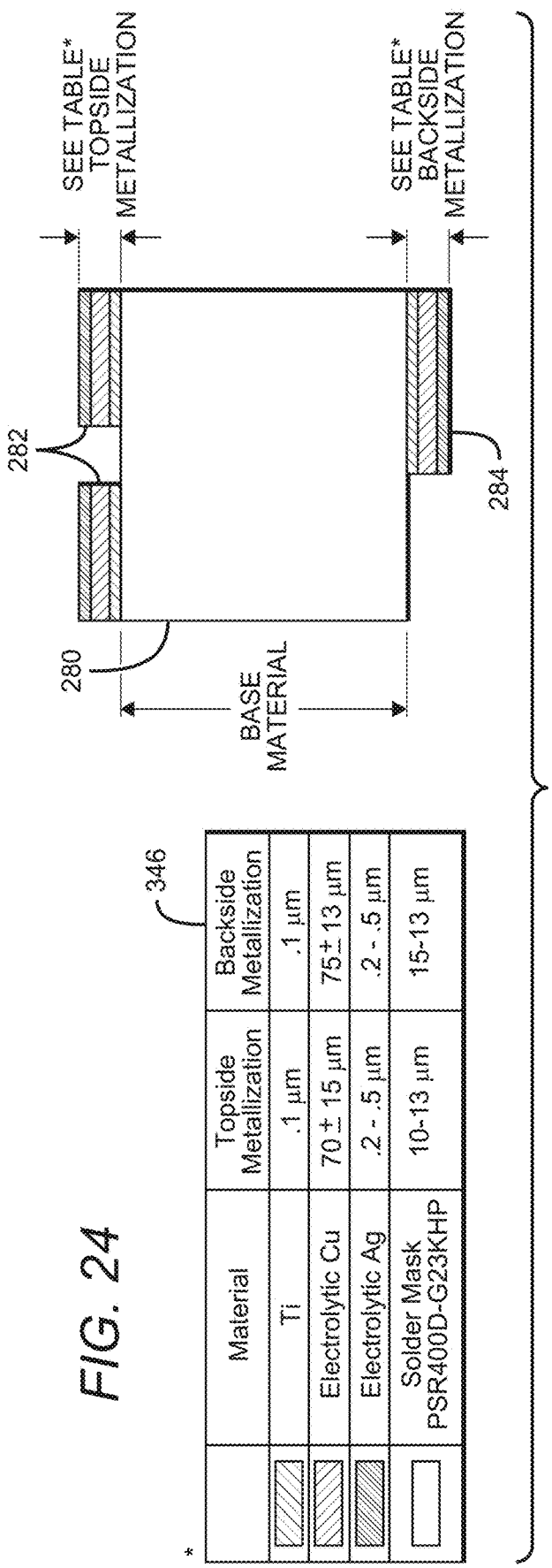
FIG. 24 is a side view and graph related to metallization that can be used in LED packages according to the present invention.

Different embodiments of the present invention can also comprise a multiple orientation component. FIG. 25 shows bottom of conventional LED package having conventional backside pads 290 being conventional −/n/+. FIG. 26 shows one embodiment of an LED package according to the present invention that can comprise backside pads 300 that are +/−/+ or −/+/−. This allows for easier pick and place and design considerations for the end user. This can also be implemented for 3V designs for different products.

Although the present invention has been described in detail with reference to certain configurations thereof, other versions are possible. Therefore, the spirit and scope of the invention should not be limited to the versions described above.

We claim:

1. A light emitting diode (LED) package comprising:
   a submount with two or more LED chips mounted on said submount with a space between adjacent ones of said two or more LED chips;
   a phosphor layer covering at least two adjacent ones of said two or more LED chips and comprising a bridge spanning the space between said at least two adjacent ones of said two or more LED chips, wherein said phosphor layer extends on a surface of the submount that is adjacent said two or more LED chips;
   a filler in said space between said at least two adjacent ones of said two or more LED chips and below said bridge;
   a reflective layer on the phosphor layer and adjacent said two or more LED chips such that said phosphor layer is between said reflective layer and said submount; and
   an encapsulant over said two or more LED chips and said submount.

2. The LED package of claim 1, wherein a top surface of said filler is aligned with or higher than top surfaces of said at least two adjacent ones of said two or more LED chips.

3. The LED package of claim 1, wherein said encapsulant comprises a curved surface.

4. The LED package of claim 3, wherein said encapsulant comprises a plurality of planar side surfaces connected to one another by said curved surface.

5. The LED package of claim 4, wherein said submount comprises a plurality of outermost edges, and at least one of said plurality of planar side surfaces is in alignment with a respective one of said plurality of outermost edges.

6. The LED package of claim 1, wherein said bridge is in the direct emission path of light from said at least two adjacent ones of said two or more LED chips.

7. The LED package of claim 6, wherein said phosphor layer is dispensed on said at least two adjacent ones of said two or more LED chips and over said space, said phosphor layer having a viscosity in the range of 1-75 PaS when dispensed.

8. The LED package of claim 1, wherein said phosphor layer comprises a phosphor in a binder, wherein the phosphor to binder ratio is 3 to 1 or greater.

9. The LED package of claim 1, wherein said filler comprises a reflective material.

10. The LED package of claim 1, wherein said filler comprises reflective particles mixed in silicone or epoxy.

11. The LED package of claim 10, wherein said reflective particles comprise $TiO_2$ or $ZrO_2$.

12. A light emitting diode (LED) package comprising:
   a submount with two or more LED chips on said submount, at least two adjacent ones of said two or more LED chips having top surfaces at substantially the same height;
   a phosphor matrix layer covering the top surfaces of said at least two adjacent ones of said two or more LED chips and covering a surface of said submount adjacent said at least two adjacent ones of said two or more LED chips, wherein said phosphor matrix layer comprises a bridge between said at least two adjacent ones of said two or more LED chips;
   a reflective layer on the phosphor matrix layer and adjacent said two or more LED chips such that said phosphor matrix layer is between said reflective layer and said submount; and a filler in a space between said at least two adjacent ones of said two or more LED chips and below said bridge.

13. The LED package of claim 12, further comprising an encapsulant over said two or more LED chips.

14. The LED package of claim 13, wherein said encapsulant comprises a curved surface and a plurality of planar side surfaces.

15. The LED package of claim 12, wherein a top surface of said filler is aligned with or higher than the top surfaces of said at least two adjacent ones of said two or more LED chips.

16. The LED package of claim 12, wherein said filler comprises a reflective material.

17. The LED package of claim 12, wherein said filler comprises reflective particles mixed in silicone or epoxy.

18. The LED package of claim 17, wherein said reflective particles comprise $TiO_2$ or $ZrO_2$.

19. A light emitting diode (LED) package comprising:
a submount;
two or more LED chips on said submount and adjacent to one another with a space between adjacent ones of said two or more LED chips;
a phosphor binder layer covering at least two adjacent ones of said two or more LED chips and comprising a bridge spanning the space between said at least two adjacent ones of said two or more LED chips to form an air gap below said bridge and between said at least two adjacent ones of the two or more LED chips, wherein said phosphor binder layer extends on a surface of the submount that is adjacent said two or more LED chips;
a reflective layer on the phosphor binder layer and adjacent said two or more LED chips such that said phosphor binder layer is between said reflective layer and said submount; and
an encapsulant over said two or more LED chips comprising a curved surface.

* * * * *